United States Patent
Rahman et al.

(10) Patent No.: US 11,626,777 B2
(45) Date of Patent: Apr. 11, 2023

(54) METHOD OF CALIBRATING A VARIABLE-SPEED BLOWER MOTOR

(71) Applicant: Lennox Industries Inc., Richardson, TX (US)

(72) Inventors: Nasim Rahman, Allen, TX (US); Wei Wang, Fort Wayne, IN (US); Yan Yang, Wylie, TX (US); Ty Winkler, Dallas, TX (US)

(73) Assignee: Lennox Industries Inc., Richardson, TX (US)

( * ) Notice: Subject to any disclaimer, the term of this patent is extended or adjusted under 35 U.S.C. 154(b) by 325 days.

(21) Appl. No.: 16/903,497

(22) Filed: Jun. 17, 2020

(65) Prior Publication Data
US 2021/0399613 A1  Dec. 23, 2021
US 2022/0320967 A9  Oct. 6, 2022

(51) Int. Cl.
*H02K 11/20* (2016.01)
*F24F 11/77* (2018.01)
*G01R 31/34* (2020.01)
*H02K 11/33* (2016.01)
*H02P 6/06* (2006.01)
*H02P 6/08* (2016.01)

(52) U.S. Cl.
CPC ............. *H02K 11/20* (2016.01); *F24F 11/77* (2018.01); *G01R 31/343* (2013.01); *H02K 11/33* (2016.01); *H02P 6/06* (2013.01); *H02P 6/08* (2013.01)

(58) Field of Classification Search
CPC ......... H02K 11/20; H02K 11/33; F24F 11/77; G01R 31/343; H02P 6/06; H02P 6/08
See application file for complete search history.

(56) References Cited

U.S. PATENT DOCUMENTS

| | | |
|---|---|---|
| 5,184,297 A | 2/1993 | Graber et al. |
| 2013/0088179 A1* | 4/2013 | Kobayashi ............ H02P 21/141 318/400.02 |
| 2014/0060034 A1* | 3/2014 | Du .......................... F04B 35/04 60/459 |
| 2014/0265957 A1* | 9/2014 | Hu ............................ H02P 6/08 318/400.15 |
| 2017/0264231 A1* | 9/2017 | Kawanishi ............ G05B 15/02 |
| 2018/0320943 A1 | 11/2018 | Schumacher et al. |
| 2019/0155255 A1 | 5/2019 | Becerra et al. |
| 2019/0267918 A1 | 8/2019 | Lemieux et al. |
| 2020/0119680 A1 | 4/2020 | Yoo et al. |
| 2020/0225653 A1 | 7/2020 | Lamont et al. |
| 2021/0285675 A1 | 9/2021 | Broker et al. |

FOREIGN PATENT DOCUMENTS

| | | | |
|---|---|---|---|
| JP | 2008238946 | * 10/2008 | ............. G04B 31/04 |
| JP | 2008238946 A | 10/2008 | |
| JP | 2015116000 A | 6/2015 | |
| TW | 201106579 A | 2/2011 | |

OTHER PUBLICATIONS

Translation of JP2008238946 has been attached.*

* cited by examiner

*Primary Examiner* — Zoheb S Imtiaz
(74) *Attorney, Agent, or Firm* — Shackelford, Bowen, McKinley & Norton, LLP

(57) ABSTRACT

A method of calibrating a motor assembly includes selecting an electric motor and a motor controller for the motor assembly, obtaining at least one electric motor parameter of the electric motor, calculating a correction factor for the electric motor based upon the at least one electric motor parameter, and programming the motor controller with the correction factor.

19 Claims, 2 Drawing Sheets

METHOD OF CALIBRATING A VARIABLE-SPEED BLOWER MOTOR

TECHNICAL FIELD

The present invention relates generally to calibrating electric motors and more particularly, but not by way of limitation, to a method of calibrating a variable-speed blower motor for use with, for example, a heating, ventilating, and air conditioning (HVAC) system.

BACKGROUND

When assembling electric motors for use in various machines, such as an HVAC system, it is often necessary to calibrate the electric motor. Conventional assembly methods include pairing an electric motor with a motor controller. The motor controller controls the operating parameters of the electric motor (e.g., to control torque of the electric motor) and is typically coupled to an HVAC controller of the HVAC system. By way of example, when the HVAC controller determines that there is a heating or cooling demand, the HVAC controller sends a signal to the motor controller to power on the electric motor to drive a fan or blower to move air through the HVAC system for heating or cooling.

Due to slight differences in the performance of a particular electric motor, it is necessary to calibrate each motor controller/electric motor pair so that the pair performs consistently with respect to torque and airflow and to ensure that the pair complies with applicable standards. If the electric motors are left un-calibrated, a first motor controller/electric motor pair might operate the fan or blower at a lower speed/torque than a second motor controller/electric motor pair due to different efficiencies resulting from variances in the manufacturing process and variances in the components of the electric motors. To account for these differences so that each motor controller/electric motor pair operates as desired, each motor controller/electric motor pair is calibrated at the time of assembly prior to being installed in the HVAC system. Calibrating each motor controller/electric motor pair is a time consuming and expensive process that requires skilled labor to complete. The calibration process requires that each motor controller/electric motor pair be tested on a dynamometer at multiple torque and speed points. After testing, changes can be made to the motor controller to correct the operation of the electric motor. A final verification test is then run. This calibration procedure requires expensive dynamometer equipment and several minutes of labor for each motor controller/electric motor pair.

SUMMARY

This summary is provided to introduce a selection of concepts that are further described below in the detailed description. This summary is not intended to identify key or essential features of the claimed subject matter, nor is it to be used as an aid in limiting the scope of the claimed subject matter.

An example of a method of calibrating a motor assembly includes selecting an electric motor and a motor controller for the motor assembly, obtaining at least one electric motor parameter of the electric motor, calculating a correction factor for the electric motor based upon the at least one electric motor parameter, and programming the motor controller with the correction factor.

An example of a method of calibrating a motor assembly includes selecting an electric motor and a motor controller for the motor assembly, scanning a label associated with the electric motor with a scanner to obtain at least one parameter of the electric motor, calculating a correction factor for the electric motor based upon the at least one electric motor parameter, and programming the motor controller with the correction factor. The electric motor and the motor controller are calibrated without a dynamometer.

BRIEF DESCRIPTION OF THE DRAWINGS

For a more complete understanding of the present invention and for further objects and advantages thereof, reference may now be had to the following description taken in conjunction with the accompanying drawings in which.

DETAILED DESCRIPTION

Various embodiments of the present invention will now be described more fully with reference to the accompanying drawings. The invention may, however, be embodied in many different forms and should not be construed as limited to the embodiments set forth herein.

Figure 1:
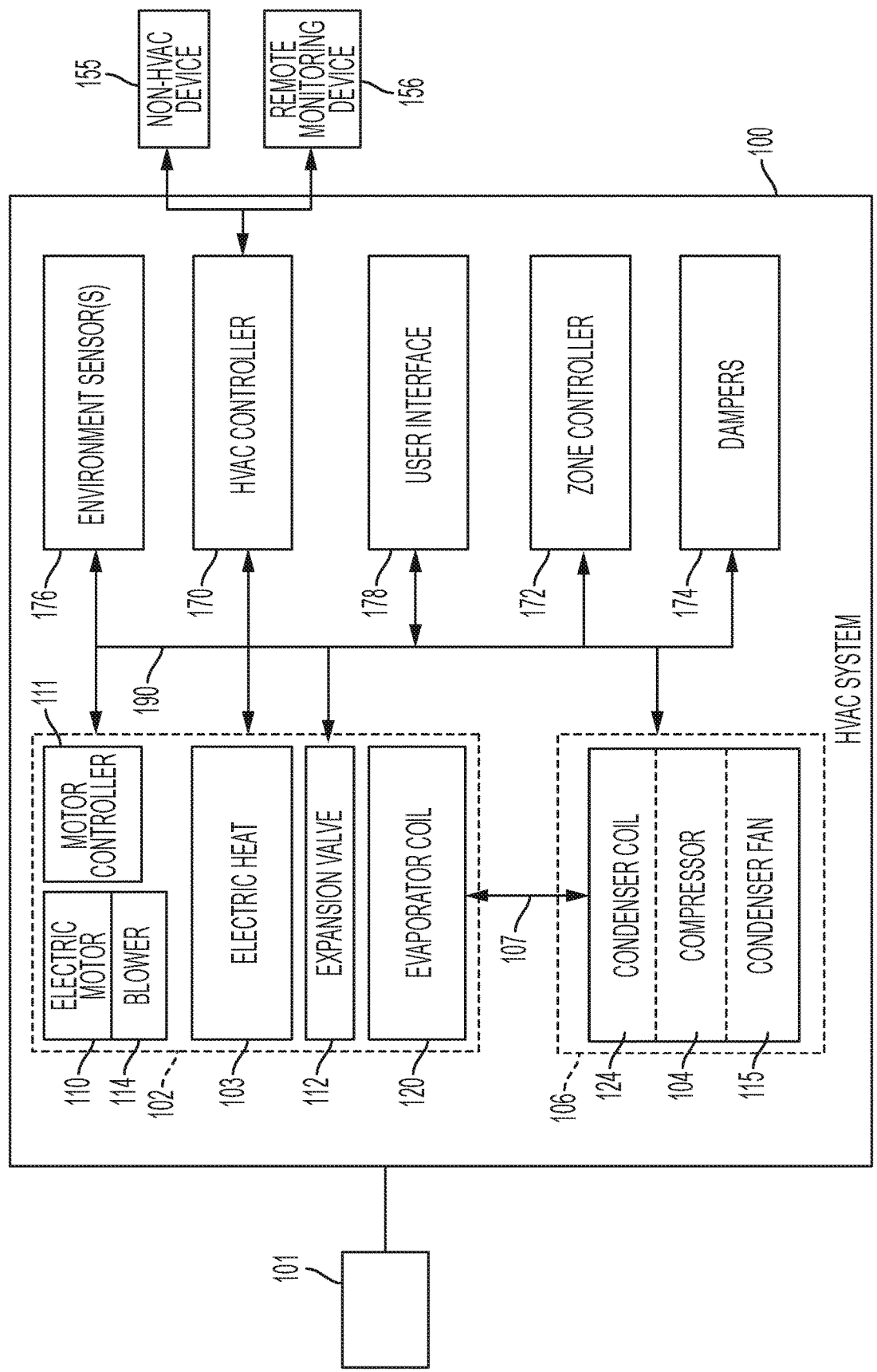
FIG. 1 is a block diagram of an illustrative HVAC system according to embodiments of the disclosure.

FIG. 1 illustrates an HVAC system 100. HVAC system 100 is configured to condition air via, for example, heating, cooling, humidifying, or dehumidifying air within an enclosed space 101. In a typical embodiment, enclosed space 101 is, for example, a house, an office building, a warehouse, and the like. Thus, HVAC system 100 can be a residential system or a commercial system such as, for example, a rooftop system. HVAC system 100 includes various components; however, in other embodiments, HVAC system 100 may include additional components that are not illustrated but typically included within HVAC systems.

HVAC system 100 includes an electric motor 110, an electric heat 103 associated with electric motor 110, and an evaporator coil 120, also typically associated with electric motor 110. In some embodiments, electric heat 103 may be replaced with a gas heat unit. Electric motor 110 is coupled to and drives a blower or fan 114 to circulate air through enclosed space 101. HVAC system 100 includes a motor controller 111 that is coupled to electric motor 110 to control operation thereof. HVAC system 100 also includes an expansion valve 112. Expansion valve 112 may be a thermal expansion valve or an electronic expansion valve. Electric motor 110, motor controller 111, electric heat 103, expansion valve 112, blower 114, and evaporator coil 120 are collectively referred to as an indoor unit 102. In a typical embodiment, indoor unit 102 is located within, or in close proximity to, enclosed space 101. HVAC system 100 also includes a compressor 104, an associated condenser coil 124, and an associated condenser fan 115, which are collectively referred to as an outdoor unit 106. In various embodiments, outdoor unit 106 and indoor unit 102 may be, for example, a rooftop unit or a ground-level unit. Compressor 104 and associated condenser coil 124 are connected to evaporator coil 120 by a refrigerant line 107. Refrigerant line 107 includes, for example, a plurality of copper pipes that connect condenser coil 124 and compressor 104 to evaporator coil 120. Compressor 104 may be, for example, a single-stage compressor, a multi-stage compressor, a single-speed compressor, or a variable-speed compressor. Electric motor 110 is configured to operate blower 114 at different capacities (e.g., variable motor speeds) to circulate air through HVAC system 100, whereby the circulated air is conditioned and supplied to enclosed space 101.

Still referring to FIG. 1, HVAC system 100 includes an HVAC controller 170 configured to control operation of the various components of HVAC system 100 such as, for example, electric motor 110, electric heat 103, and compressor 104 to regulate the environment of enclosed space 101. In some embodiments, HVAC system 100 includes an inside unit controller and an outside unit controller that communicate with and receive instructions from HVAC controller 170. In some embodiments, HVAC system 100 can be a zoned system. HVAC system 100 includes a zone controller 172, dampers 174, and a plurality of environment sensors 176. In a typical embodiment, HVAC controller 170 cooperates with zone controller 172 and dampers 174 to regulate the environment of enclosed space 101.

HVAC controller 170 may be an integrated controller or a distributed controller that directs operation of HVAC system 100. HVAC controller 170 includes an interface to send/receive, for example, thermostat calls, temperature setpoints, blower control signals for motor controller 111 environmental conditions, and operating mode status for various zones of HVAC system 100. The environmental conditions may include indoor temperature and relative humidity of enclosed space 101. In a typical embodiment, HVAC controller 170 also includes a processor and a memory to direct operation of HVAC system 100 including, for example, sending signals to motor controller 111 to control a speed of electric motor 110.

Still referring to FIG. 1, in some embodiments, the plurality of environment sensors 176 are associated with HVAC controller 170 and also optionally associated with a user interface 178. The plurality of environment sensors 176 provides environmental information within a zone or zones of enclosed space 101 such as, for example, temperature and/or humidity of enclosed space 101 to HVAC controller 170. The plurality of environment sensors 176 may also send the environmental information to a display of user interface 178. In some embodiments, user interface 178 provides additional functions such as, for example, operational, diagnostic, status message display, and a visual interface that allows at least one of an installer, a user, a support entity, and a service provider to perform actions with respect to HVAC system 100. In some embodiments, user interface 178 is, for example, a thermostat. In other embodiments, user interface 178 is associated with at least one sensor of the plurality of environment sensors 176 to determine the environmental condition information and communicate that information to the user. User interface 178 may also include a display, buttons, a microphone, a speaker, or other components to communicate with the user. Additionally, user interface 178 may include a processor and memory configured to receive user-determined parameters such as, for example, a relative humidity of enclosed space 101 and to calculate operational parameters of HVAC system 100 as disclosed herein.

HVAC system 100 is configured to communicate with a plurality of devices such as, for example, a communication device 155, a monitoring device 156, and the like. In a typical embodiment, and as shown in FIG. 1, monitoring device 156 is not part, of HVAC system 100. For example, monitoring device 156 is a server or computer of a third party such as, for example, a manufacturer, a support entity, a service provider, and the like. In some embodiments, monitoring device 156 is located at an office of, for example, the manufacturer, the support entity, the service provider, and the like.

In a typical embodiment, communication device 155 is a non-HVAC device having a primary function that is not associated with HVAC systems. For example, non-HVAC devices include mobile-computing devices configured to interact with HVAC system 100 to monitor and modify at least some of the operating parameters of HVAC system 100. Mobile computing devices may be, for example, a personal computer (e.g., desktop or laptop), a tablet computer, a mobile device (e.g., smart phone), and the like. In a typical embodiment, communication device 155 includes at least one processor, memory, and a user interface such as a display. One skilled in the art will also understand that communication device 155 disclosed herein includes other components that are typically included in such devices including, for example, a power supply, a communications interface, and the like.

Zone controller 172 is configured to manage movement of conditioned air to designated zones of enclosed space 101. Each of the designated zones includes at least one conditioning or demand unit such as, for example, electric heat 103 and user interface 178, only one instance of user interface 178 being expressly shown in FIG. 1, such as, for example, the thermostat. HVAC system 100 allows the user to independently control the temperature in the designated zones. In a typical embodiment, zone controller 172 operates dampers 174 to control air flow to the zones of enclosed space 101.

A data bus 190, which in the illustrated embodiment is a serial bus, couples various components of HVAC system 100 together such that data is communicated therebetween. Data bus 190 may include, for example, any combination of hardware, software embedded in a computer readable medium, or encoded logic incorporated in hardware or otherwise stored (e.g., firmware) to couple components of HVAC system 100 to each other. As an example and not by way of limitation, data bus 190 may include an Accelerated Graphics Port (AGP) or other graphics bus, a Controller Area Network (CAN) bus, a front-side bus (FSB), a HYPERTRANSPORT (HT) interconnect, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local bus (VLB), or any other suitable bus or a combination of two or more of these. In various embodiments, data bus 190 may include any number, type, or configuration of data buses 190, where appropriate. In particular embodiments, one or more data buses 190 (which may each include an address bus and a data bus) may couple HVAC controller 170 to other components of HVAC system 100. In other embodiments, connections between various components of HVAC system 100 are wired. For example, conventional cable and contacts may be used to couple HVAC controller 170 to the various components. In some embodiments, a wireless connection is employed to provide at least some of the connections between components of HVAC system 100 such as, for example, a connection between HVAC controller 170 and electric motor 110 or the plurality of environment sensors 176.

As noted above, slight differences in the performance of an electric motor and/or a motor controller, such as electric motor 110 and motor controller 111, can lead to variances in performance between respective electric motor/motor controller pairs. These variances, if left uncorrected, result in variations of air flow through HVAC system 100. Operating HVAC system 100 with an improperly calibrated electric motor 110 can be detrimental to the performance and/or safety of HVAC system 100. Conventional electric motors and motor controllers are assembled together in a factory where the matched pair is calibrated and tested prior to being shipped off to a manufacturer of HVAC systems that installs the calibrated and tested matched pair into the HVAC system. Calibrating each motor controller/electric motor pair is a time consuming and expensive process. The calibration process requires that each motor controller/electric motor pair be tested on a dynamometer at multiple torque and speed points. After testing, adjustments are made to the motor controller. A final verification test is then run to ensure that the matched pair is operating as intended. This calibration procedure requires several minutes of skilled labor for each motor controller/electric motor pair.

While the above calibration method works, it does not allow for the electric motor and motor controller to be independently sourced by the HVAC manufacturer for integration into the HVAC system, as this method requires that the electric motor and motor controller be assembled and calibrated prior to being sent to the HVAC manufacturer. The HVAC manufacturer could assemble the electric motor and motor controller together on site and then perform the calibration method; however, this is undesirable as the conventional calibration method set forth above is time consuming and requires equipment and skilled labor that are expensive.

Figure 2:
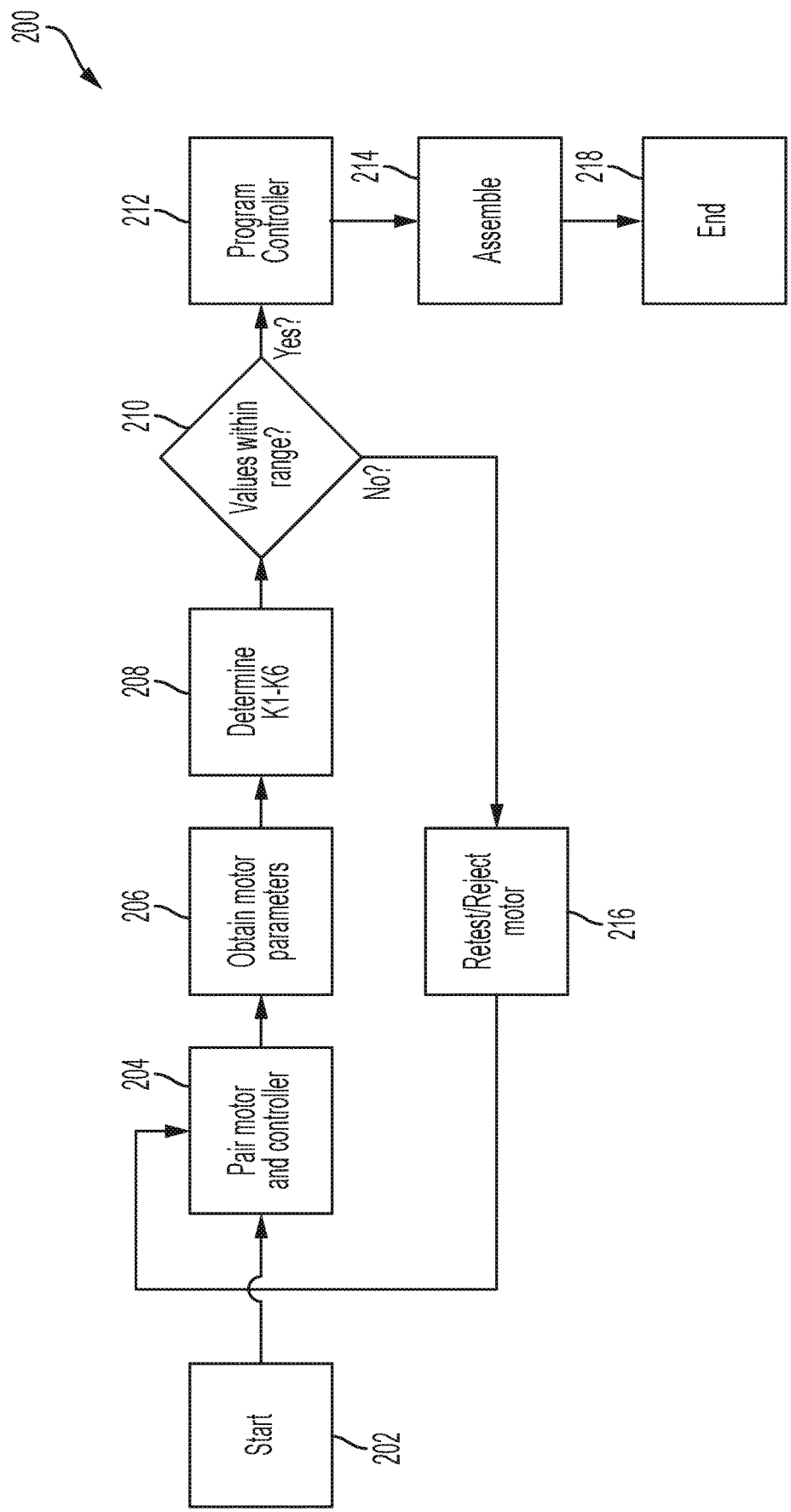
FIG. 2 is flow diagram illustrating a method of calibrating an electric motor according to embodiments of the disclosure.

FIG. 2 illustrates an exemplary calibration method 200 that eliminates the need for a time consuming calibration process by the HVAC manufacturer. By way of example, method 200 is discussed with respect to electric motor 110 and motor controller 111 of indoor unit 102. HVAC system 100. Method 200 could similarly be used to calibrate compressor 104 and an associated compressor controller. Those having skill in the art will recognize that method 200 may also be easily adapted for use with a wide variety of systems. For example, method 200 may be used to calibrate a wide variety of systems/machines that include electric motor/motor controller pairings. Method 200 improves production rates, reduces equipment cost as no dynamometer is needed, and reduces labor costs.

Method 200 begins at step 202. From step 202, method 200 proceeds to step 204. In step 204, electric motor 110 is paired with motor controller 111. For example, during assembly of HVAC system 100, one electric motor 110 and one motor controller 111 are selected and assembled together to form a motor assembly. Assembly includes coupling motor controller 111 to electric motor 110 with one or more electrical leads so that motor controller 111 can control the operation of electric motor 110. After step 204, method 200 proceeds to step 206.

In step 206, a set of parameters that describe electric motor 110 are obtained. Electric motor 110 may include a tag or label that stores the set of parameters and is configured to be read by, for example, a bar code scanner, a radio frequency identification ("RFID") scanner, a quick response "QR" code scanner, text recognition (e.g., optical character recognition using a camera), or the like. In some embodiments, the label associated with electric motor 110 includes plain text that is read by user and manually entered instead of being scanned or read by a reader. The parameters for electric motor 110 include information that permits calculation of a correction factor used to calibrate the motor assembly so that the electric motor 110 and motor controller 111 are calibrated without having to use a dynamometer on the assembly line. The correction factor is used to align an expected torque output of electric motor 110 with an actual torque output of electric motor 110. The set of parameters for electric motor 110 may include, but are not limited to, one or more of the following parameters:

motor resistance of U, V, and W phases at, for example, 20° C.;

back EMF (V), U-V, U-W, V-W at, for example, 400 RPM and 1200 RPM;

no load input power (Watts) at, for example, 400 RPM and 1200 RPM;

customer part number;

vendor code;

supplier part number;

production date; and serial number.

For example, at the time of manufacture of electric motor 110, the supplier of electric motor 110 performs testing of each electric motor 110 to determine values for each parameter of the set of parameters. This information is then encoded into a label that is associated with electric motor 110. In various embodiments, the set of parameters may include other data/information as desired. In some embodiments, the label is a bar code, an RFD tag, a QR code, or the like. The label may be affixed directly to electric motor 110 or otherwise associated with electric motor 110 for reference at a later time (e.g., affixed to packaging of electric motor 110). After the set of parameters for electric motor 110 have been collected, method 200 proceeds to step 208.

In step 208, the set of parameters collected in step 206 are used to determine values of six parameters K1-K6. Parameters K1-K6 are as follows: measured rotor flux (K1); friction torque slope (K2); friction torque bias (K3); saturation starting point torque level (K4); saturation torque slope (K5); and torque scaling factor (K6). Using the parameters collected in step 206, an expected torque output of the motor assembly can be determined. The expected torque output of the motor assembly can then be used to determine the correction factor for electric motor 110. For example, when motor controller 111 provides a torque command to electric motor 110 to generate a torque of 50%, it can be determined from the parameters collected in step 206 that the expected torque output may be 60%. The 10% delta between the torque command of 50% and the expected torque output of 60% is likely due to variances resulting from the manufacturing process. Deltas between the desired torque command and the actual output of the motor assembly can result in inefficient operation of HVAC system 100, failure to comply with performance and/or safety standards, and the like. Parameters K1-K6 are used to determine the correction factor that is used to adjust the actual torque output by electric motor 110 to be closer to the desired torque command. Calculation of the parameters K1-K6 may be performed by a computer processor executing a computer program stored on a computer-readable storage medium and is discussed in more detail below. Once parameters K1-K6 have been calculated, the correction factor to be applied to motor controller 111 may then be determined. The determination of the correction factor is discussed in more detail below. From step 208, method 200 then proceeds to step 210.

In step 210, a check is performed to confirm if the motor parameters provided by the supplier of electric motor 110 are within spec or not. For example, checks are performed without the electric motor 110 running to confirm that K values on the label associated with electric motor 110 are within range and that the motor ID on the label matches the motor ID of electric motor 110. If the parameters are within spec, method 200 proceeds from step 210 to step 212. If the parameters are not within spec, method 200 proceeds from step 210 to step 216 and the motor assembly is either retested or is rejected. In some embodiments, indoor unit 102, not just the motor assembly, is retested or rejected. Method 200 then returns to step 204 where a new electric motor 110 and/or motor controller 111 are selected. In step 212, motor controller 111 is programmed with the correction factor and verified. Upon completion of step 212, method 200 proceeds to step 214. In step 214, the motor assembly may be installed into indoor unit 102. After step 214, method 200 ends at step 218.

Machine Model

Electric motor 110 may be, for example, an electronically controlled surface mounted permanent magnet synchronous machine (SM-PMSM). If properly controlled, the motor performance of electric motor 110 is highly linear and predictable. The calibration method discussed in the instant disclosure is meant to compensate for imperfections that are not directly accounted for. The instant disclosure provides an accurate torque model and efficiency model for electric motor 110.

In rotor reference frame and steady state operation, assuming a well-balanced motor, electric motor 110 can be modelled by the following equations:

$$V_q = RI_q + \omega_r L_d I_d + \omega_r \lambda_{pm} \quad \text{Eq. 1}$$

$$V_d = RI_d - \omega_r L_q I_q \quad \text{Eq. 2}$$

$$T_e = (3/2)(p/2)[\lambda_{pm} I_q + (L_d - L_q) I_q I_d] \quad \text{Eq. 3}$$

$V_q$, $V_d$, $I_q$, $I_d$ are the d, q axis voltages and currents, respectively, supplied by motor controller 111. R is the phase resistance, $L_d$, $L_q$ are the d, q axis resistance inductance, $\omega_r$ is the rotor speed in radiant, $\lambda$pm is the permanent magnet flux. p is the number of poles and Te is the electromagnetic torque produced by electric motor 110.

In the above equation (3), the first component of torque is generated by permanent magnet and stator winding excitation (i.e., reaction torque). The second component of torque is generated by stator current excitation and rotor structure saliency (i.e., reluctance torque). If the rotor structure is non-salient, the difference between Ld and Lq is very small. Thus, the torque contribution from the reluctance torque is very small. Furthermore, when $I_d=0$, which is the case for majority of the operational range of electric motor 110, the reluctance torque is zero. Therefore, the reluctance torque item can be ignored from the above equation (3) to simplify the analysis without losing accuracy.

Some of the parameters of electric motor 110 can be directly measured by the manufacturer (e.g., rated back EMF En at rated speed 1000 RPM). Considering all these factors together, the equation (3) can be reduced to the following:

$$T_e = \frac{\sqrt{3}}{104.719} E_n I_q \quad \text{Eq. 4}$$

The major source of torque error occurs around the nominal back EMF, En, and the q axis current $I_q$. That includes the motor to motor back EMF variation, current sampling error. Since the friction of electric motor 110 due to bearing and windage resistance reduces the effective output, the final torque output needs to account for torque from friction ($T_{fr}$):

$$T_o = T_e - T_{fr} \quad \text{Eq. 5}$$

Model for torque loss due to non-linearity of drive circuit

The sampling circuit is critical to the drive control accuracy. As from equation (4), the output torque is proportional to the q axis current. Any drift or skew of the current will be reflected on the torque output. Assuming the current waveform is properly controlled to be sinusoidal and the steady state error for current control loop is zero on the drive system, the output current accuracy is entirely dependent upon the current sampling circuit accuracy. The sampling method employed in the instant disclosure relies upon sampling resistance to convert a current signal from an inverter bridge into voltage, which is then amplified and fed into an ADC channel of motor controller 111.

$$V_i = i\,Rs*K + V\text{bias} \quad \text{Eq. 6}$$

The source of error is from the resistor value variation and the amplifying circuit amplification ratio which again is tied to the resistors in the circuit. To compensate for this error, the drive should be tested at different current values and calibrated by the manufacturer.

Model for Torque Loss Due to Motor to Motor Back-EMF Variation

Motor back EMF varies slightly between each electric motor 110. In normal manufacturing conditions, the variation may be limited to +/−3%. Nonetheless, from equation (4), the variation directly translates to errors in the value of torque. Thus, the impact of back EMF needs to be compensated for. In most cases, the manufacturer of electric motor 110 can accurately measure the back EMF for each electric motor 110 at the time of manufacture and can be included, for example, as a part of the label associated with each electric motor 110. In some embodiments, the manufacturer of electric motor 110 will provide a value for rated back EMF at 1000 RPM and encode this information into the label associated with electric motor 110.

Torque Compensation Due to Friction and Windage

Friction and windage torque of electric motor 110 are typically relatively small values. For example, friction and windage torque might only account for 1 to 2% of torque loss. Nonetheless, at low torque and high speed conditions, friction and windage torque can be a significant portion of torque loss and needs to be compensated for. Friction and windage torque can be modelled by the following equation:

$$T_{fr} = K_2 \omega r^2 + K_1 \omega r + K_0 \quad \text{Eq. 7}$$

The windage component follows laws governing fan speed and is proportional to the square of speed. Additionally, the smoother the surface of the rotor of electric motor 110, the less windage torque there is. Windage torque does not come into play until higher motor speeds. The friction torque from the bearing(s) of electric motor 110, on the other hand, dominates the medium to low speed range loss. The alignment of front and rear bearing plays a major roll of bearing friction force and torque. Friction torque should be independent of speed, however as speed increases, the friction coefficient changes which requires that the equation include a speed related factor for friction force. Data regarding friction torque is provided by the manufacturer of electric motor 110. For example, the manufacturer may test electric motor 110 at three different speeds (e.g., 400 RPM, 800 RPM, and 1200 RPM) and record the shaft torque and windage loss. The manufacturer could then us this data on the label associated with electric motor 110. With three equations and three unknown parameters, the coefficient $K_2$, $K_1$, and $K_0$ can be solved for each motor.

$$T_{fr1} = K_2\omega_{r1}^2 + K_1\omega_{r1} + K_0 \quad \text{Eq. 8}$$

$$T_{fr2} = K2\omega_{r2}^2 + K_1\omega_{r2} + K_0 \quad \text{Eq. 9}$$

$$T_{fr3} = K2\omega_{r3}^2 + K_1\omega_{r2} + K_0 \quad \text{Eq. 10}$$

The final torque equation for the torque of electric motor 110 is:

$$T_o = \frac{\sqrt{3}}{104.719} E_n i_q - K_2\omega_r^2 - K_1\omega_r - K_o \quad \text{Eq. 11}$$

Reference current for motor controller 111 can be calculated as:

$$I_q^* = \frac{104.719}{\sqrt{3E_n^*}} (T_{cmd} + K_2\omega_r^2 + K_1\omega_r + K_0) \quad \text{Eq. 12}$$

The reference current is the amount of current that motor controller 111 will provide to electric motor 110 to align the amount of torque that is actually produced by electric motor 110 with the desired amount of torque to generate the proper speed of blower 114. In other words, the reference current is the corrected current that, when supplied to electric motor 110, accounts for any offsets or variances in the performance of blower 114.

Calculation of parameters $K_1$-$K_6$

Calculation of parameters $K_1$-$K_6$ may be performed by a computer program executed by computer that comprises a processor and memory. For example, the parameters that describe electric motor 110 may be obtained by scanning the label associated with electric motor 110. The scanner passes that data to a computer that is programmed to determine parameters $K_1$-$K_6$ and ultimately the correction factor for electric motor 110. In some embodiments, parameters $K_4$-$K_6$ are obtained from a database. For example, the label may be scanned with the scanner. The label itself may be encoded with the values of the parameters. In some embodiments, the label may include an identifier for the electric motor 110. The scanner then uses the identifier to access the parameters for that electric motor 110 from a database. The database may be populated by the manufacturer of electric motor 110 and made available through the Internet. In other embodiments, parameters $K_4$-$K_6$ are read from the label associated with electric motor 110 by a person and entered into computer program. The determination of parameters $K_1$-$K_6$ is described below.

$K_1$ is designed to account for counter-electromotive force or back EMF variations for each motor. However, since back EMF is not directly used in the calculations, it is introduced in terms of flux. $K_1$ is the rotor flux, which is a function of the back EMF. Parameter $K_1$ may be determined as follows:

$$K_1 = \lambda_{PM} = \frac{E_n}{\omega_r} \quad \text{Eq. 13}$$

$$K_1 = \text{avg}\_\lambda_{PM} \times \frac{E_n}{\text{avg}\_E_n} \quad \text{Eq. 14}$$

Where $\lambda_{PM}$ is permanent magnet flux, $\text{avg}\_\lambda_{PM}$ is the average value for permanent magnet flux, $E_n$ is the back EMF (this value may obtained by scanning the label associated with electric motor 110), and $\text{avg}\_E_n$ is the average back EMF value. The back EMF readings are line to line RMS voltage values. The average back EMF value is obtained through no-load testing of 30 electric motors.

The average flux ($\text{avg}\_\lambda_{PM}$) is measured through the following equation:

$$\text{avg}_{\lambda_{PM}} = \frac{\frac{\text{avg}\_E_n \times \sqrt{2}}{\sqrt{3}}}{\omega_r \times 2\pi/60 \times p/2} \times 2\pi \quad \text{Eq. 15}$$

Where $\omega_r$ is motor speed (rpm), and p is the number of poles.

Commanded torque is a percentage of nominal torque and is represented as $T_{cmd}$. The adjusted reference torque is $T_{ref}$. Without torque calibration, $T_{cmd} = T_{ref}$. Rotor flux, $\lambda_{pm}$, is used for torque calculation and needs to be updated with actual measured rotor flux $K_1$ that is obtained from method 200. The friction torque loss, $T_{fr}$, resulting from bearing friction and windage needs to be compensated. $K_3$ is the friction torque slope and $K_2$ is the friction torque bias. Friction torque loss is calculated using:

$$T_{fr} = K_2\omega_r + K_3 \quad \text{Eq. 16}$$

$$T_{ref} = T_{cmd} + T_{fr} = T_{cmd} + K_2\omega_r + K_3 \quad \text{Eq. 17}$$

During manufacture of electric motor 110, the manufacturer measures the friction torque of electric motor 110 at two different speeds. This data is stored and made available for retrieval via the label. Friction torque versus speed slope $K_3$ and bias $K_2$ can then be calculated. The friction torque component is first normalized and is a percentage of nominal torque.

Ideally, motor torque output is linear versus input current. However, at higher torque levels, electric motor 110 starts to saturate and the same incremental current inputs begin to produce less torque than at lower torque levels. This saturation effect needs to be compensated for. Saturation typically starts to be tangential at around 60% torque level for a 1 horsepower motor. The saturation causes about a 2% torque drop at full torque level for a 1 horsepower motor. The starting point is different from design to design. Starting torque level is defined as percentage of total torque output $K_4$. The compensation for saturation is simplified as a scaling factor $K_5$ in regards to torque input. If the torque command is less than or equal to $K_4$ (60% for a 1 horsepower motor), no saturation compensation is needed and $T_{ref}$ is unchanged:

$$T_{ref} = T_{cmd} + K_2\omega_r + K_3 \quad \text{Eq. 18}$$

If the torque command is greater than $K_4$ (60% for a 1 horsepower motor), $T_{ref}$ is scaled up to compensate for the saturation:

$$T_{ref} = (T_{cmd} + K_2\omega_r + K_3)\left\{1 + \frac{K_5(T_{cmd} - K_4)}{1 - K_4}\right\} \quad \text{Eq. 19}$$

$$T_{ref} = (T_{cmd} + K_2\omega_r + K_3)\{1 + K_5(T_{cmd} - K_4)1 - K_4\} \quad \text{Eq. 20}$$

$K_6$ is used to account for imperfections of the algorithm and any intended scaling of torque output for compliance purposes. If the motor torque command is less than or equal to $K_4$, $T_{ref}$ is calculated as:

$$T_{ref} = (T_{cmd} + K_2\omega_r + K_3)K_6 \quad \text{Eq. 21}$$

If the motor torque command is greater than $K_4$, $T_{ref}$ is calculated as:

$$T_{ref} = K_6(T_{cmd} + K_2\omega_r + K_3)\left\{1 + \frac{K_5(T_{cmd} - K_4)}{1 - K_4}\right\} \quad \text{Eq. 22}$$

When the final reference torque $T_{ref}$ is calculated, the reference current can be calculated as:

$$T_e = \frac{3}{2}\left(\frac{p}{2}\right)(\lambda_d I_q - \lambda_q I_d) = \frac{3}{2}\left(\frac{p}{2}\right)[\lambda_{pm} I_q + (L_d - L_q) I_q I_d] \quad \text{Eq. 23}$$

Since the difference between d-axis inductance $L_d$ and q-axis inductance $L_q$ are very small for the current motor design, the torque generated from the inductance differences are very small even at full torque output (e.g., around 1-2 oz-ft). For torque calibration purposes, this component of torque is not compensated for. Nominal motor inductance parameters can be used without losing overall accuracy.

For purposes of this patent application, the term computer-readable storage medium encompasses one or more tangible computer-readable storage media possessing structures. As an example and not by way of limitation, a computer-readable storage medium may include a semiconductor-based or other integrated circuit (IC) (such as, for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, a flash memory card, a flash memory drive, or any other suitable tangible computer-readable storage medium or a combination of two or more of these, where appropriate.

Particular embodiments may include one or more computer-readable storage media implementing any suitable storage. In particular embodiments, a computer-readable storage medium implements one or more portions of the processor, one or more portions of the system memory, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody encoded software.

In this patent application, reference to encoded software may encompass one or more applications, bytecode, one or more computer programs, one or more executables, one or more instructions, logic, machine code, one or more scripts, or source code, and vice versa, where appropriate, that have been stored or encoded in a computer-readable storage medium. In particular embodiments, encoded software includes one or more application programming interfaces (APIs) stored or encoded in a computer-readable storage medium. Particular embodiments may use any suitable encoded software written or otherwise expressed in any suitable programming language or combination of programming languages stored or encoded in any suitable type or number of computer-readable storage media. In particular embodiments, encoded software may be expressed as source code or object code. In particular embodiments, encoded software is expressed in a higher-level programming language, such as, for example, C, Python, Java, or a suitable extension thereof. In particular embodiments, encoded software is expressed in a lower-level programming language, such as assembly language (or machine code). In particular embodiments, encoded software is expressed in JAVA. In particular embodiments, encoded software is expressed in Hyper Text Markup Language (HTML), Extensible Markup Language (XML), or other suitable markup language.

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. Although certain computer-implemented tasks are described as being performed by a particular entity, other embodiments are possible in which these tasks are performed by a different entity.

Conditional language used herein, such as, among others, "can," "might," "may," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

What is claimed is:

1. A method of calculating a correction factor for an electric motor, the method comprising:
    obtaining at least one electric motor parameter of the electric motor;
    calculating the correction factor for the electric motor of a heating, ventilating, and air conditioning (HVAC) system based on the at least one electric motor parameter, wherein the calculating the correction factor consists of:
        determining an amount of electromagnetic torque produced by the electric motor;
        determining an amount of torque loss acting against the electric motor;
        determining a rotor flux of the electric motor;
        determining a friction torque slope of the electric motor;

determining a friction torque bias of the electric motor; and programming a motor controller associated with the electric motor with the correction factor.

2. The method of claim 1, wherein the obtaining comprises scanning a label associated with the electric motor with a scanner, the label comprising the at least one electric motor parameter.

3. The method of claim 1, wherein the at least one electric motor parameter comprises at least one of the following: a resistance of the electric motor, a back EMF of the electric motor, and a no load input power of the electric motor.

4. The method of claim 3, wherein the back EMF of the electric motor is measured at multiple speeds.

5. The method of claim 1, wherein the determining the amount of torque loss comprises determining an amount of friction torque acting against the electric motor.

6. The method of claim 1, wherein the determining the amount of torque loss comprises determining an amount of back EMF acting against the electric motor.

7. The method of claim 1, wherein the determining the amount of torque loss comprises determining an amount of windage torque acting against the electric motor.

8. The method of claim 1, wherein the calculating the correction factor comprises scaling up the correction factor when a torque output of the electric motor exceeds a saturation starting point torque level of the electric motor.

9. The method of claim 8, wherein the saturation starting point torque level of the electric motor is 60% of a maximum torque output by the electric motor.

10. The method of claim 1, wherein the calculating the correction factor comprises determining an expected torque output by the electric motor.

11. The method of claim 10, wherein the correction factor is a reference current that aligns the expected torque output of the electric motor with a desired torque output of the electric motor.

12. The method of claim 1, wherein the calculating the correction factor comprises determining a resistor value variation of the electric motor.

13. A method of calculating a correction factor for an electric motor, the method comprising:

scanning a label associated with the electric motor to obtain at least one electric motor parameter of the electric motor;

calculating the correction factor for the electric motor of a heating, ventilating, and air conditioning (HVAC) system based on the at least one electric motor parameter, wherein the calculating the correction factor consists of:

determining an amount of electromagnetic torque produced by the electric motor;

determining an amount of torque loss acting against the electric motor;

determining a rotor flux of the electric motor;

determining a friction torque slope of the electric motor;

determining a friction torque bias of the electric motor; and programming a motor controller associated with the electric motor with the correction factor.

14. The method of claim 13, wherein the at least one electric motor parameter comprises at least one of the following: a resistance of the electric motor, a back EMF of the electric motor, and a no load input power of the electric motor.

15. The method of claim 13, wherein the determining the amount of torque loss comprises determining an amount of friction torque acting against the electric motor.

16. The method of claim 13, wherein the determining the amount of torque loss comprises determining an amount of back EMF acting against the electric motor.

17. The method of claim 13, wherein the determining the amount of torque loss comprises determining an amount of windage torque acting against the electric motor.

18. The method of claim 13, wherein the calculating the correction factor comprises scaling up the correction factor when a torque output of the electric motor exceeds a saturation starting point torque level of the electric motor.

19. The method of claim 13, wherein the correction factor is a reference current that aligns an expected torque output of the electric motor with a desired torque output of the electric motor.

* * * * *